United States Patent
Izawa et al.

(10) Patent No.: US 8,632,688 B2
(45) Date of Patent: Jan. 21, 2014

(54) PLASMA PROCESSING APPARATUS AND PLASMA PROCESSING METHOD

(75) Inventors: Masaru Izawa, Hino (JP); Kouichi Yamamoto, Hikari (JP); Kenji Nakata, Hikari (JP); Atsushi Itou, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 167 days.

(21) Appl. No.: 13/236,800

(22) Filed: Sep. 20, 2011

(65) Prior Publication Data

US 2013/0045547 A1    Feb. 21, 2013

(30) Foreign Application Priority Data

Aug. 15, 2011  (JP) .................. 2011-177388

(51) Int. Cl.
   *G01L 21/30*   (2006.01)
   *G01R 31/00*   (2006.01)
(52) U.S. Cl.
   USPC ............................................ 216/59; 216/58
(58) Field of Classification Search
   None
   See application file for complete search history.

(56) References Cited

U.S. PATENT DOCUMENTS

| 6,475,918 B1 | 11/2002 | Izawa et al. | |
| 2009/0026170 A1* | 1/2009 | Tanaka et al. | 216/60 |
| 2009/0130856 A1* | 5/2009 | Shannon et al. | 438/710 |

FOREIGN PATENT DOCUMENTS

| JP | 7-65993 | 3/1995 |
| JP | 2001-110784 | 4/2001 |
| JP | 2004-281442 | 10/2004 |

OTHER PUBLICATIONS

Mumeo Furuse et al., Measurement of a Three-Dimensional Distribution of Microwave Electric Field in Electron Cyclotron Resonance Plasmas, Japanese Journal of Applied Physics, Jul. 1997, pp. 4617-4619, vol. 36, Part 1, No. 7B.

* cited by examiner

*Primary Examiner* — Duy Deo
*Assistant Examiner* — Bradford Gates
(74) *Attorney, Agent, or Firm* — Antonelli, Terry, Stout & Kraus, LLP.

(57) ABSTRACT

In a plasma processing apparatus in which a wafer is processed while supplying radio frequency power to electrodes disposed in a sample stage in a processing chamber within a reactor via a matching box, by matching a specific value of power at transition points of data values of at least two kinds among characteristic data including light emission intensity of the plasma, magnitude of its time variation, a matching position of the matching box, and a change of a value of a voltage of the radio frequency power supplied to the electrodes detected by varying the power to a plurality of values during the processing with a value detected by using characteristic data which is detected during the processing executed on a wafer of the same kind in a different reactor, the differences of the states inside the processing chamber or plasma among a plurality of semiconductor processing apparatuses or reactors are reduced.

4 Claims, 9 Drawing Sheets

PLASMA PROCESSING APPARATUS AND PLASMA PROCESSING METHOD

BACKGROUND OF THE INVENTION

The present invention relates to a plasma processing apparatus or a plasma processing method for processing a substrate-shaped sample such as a semiconductor wafer disposed in a processing chamber which is disposed within a vacuum vessel using plasma formed in the processing chamber, in particular, to a plasma processing apparatus or a plasma processing method for conducting etching processing on film layers disposed on a sample while supplying radio frequency power to electrodes within a sample stage on which the sample is mounted to machine it to predetermined profiles for electrodes, interconnections, and contact holes.

In manufacturing processes of semiconductor devices, thin film layers such as a polycrystalline Si film and an insulation film formed on a semiconductor wafer (substrate) to be processed are subjected to micro machining with dry etching to form gate electrodes and interconnections. In this apparatus for conducting dry etching machining, etching gas is introduced into the dry etching apparatus which is a vacuum vessel and a radio frequency electric field is introduced into the vacuum vessel to generate plasma. A thin film is etched by causing active species and ions generated in the plasma to be incident upon the wafer. As in etching, a mask such as a resist thin film having electrodes, interconnections, or hole patterns transcribed thereon is formed on an oxide film. In the dry etching, a poly-Si film, an insulation film, or the like is machined selectively with respect to the mask or an underlying layer and thereby a desired machined profile is formed.

In recent years, semiconductor manufacturing lines have become large in scale as the semiconductor market expands. Furthermore, in order to raise the productivity per unit area of the line from the viewpoint of the production cost, a semiconductor processing apparatus (multi-reactor) obtained by connecting to a transfer mechanism a plurality of processing vessels (reactors) each including a vacuum vessel having therein a processing chamber in which a wafer as a substrate-shaped sample to be processed is disposed and plasma for processing the wafer is formed is mainly used.

In addition, as the scale of the manufacturing line becomes large, execution of processing is conducted on wafers which have the same dimension and structure and which can be considered to comply with the same specifications in a plurality of semiconductor processing apparatuses with respect to one process of wafer processing. Such execution of substantially the same processing in a plurality of apparatuses in a manufacturing line is conducted in dry etching processing as well.

For improving the yield in the manufacturing line of semiconductor apparatuses such as semiconductor devices, it is demanded in semiconductor manufacturing apparatuses such as etching apparatuses, which execute various processes in manufacturing respectively, that processing is conducted to make characteristics and results of processing more uniform in the in-plane direction of the wafer and that differences in machining results among a plurality of wafers are small. For example, in a dry etching apparatus, it is demanded that characteristics such as the density and intensity of plasma generated in the reactor have high uniformity in the in-plane direction of the wafer. In addition, it is demanded that the plasma density can be made a predetermined value or more, for example $10^{10}/cm^3$ or more, to improve the processing rate (speed), that stable plasma can be formed when the pressure of gas during processing in the processing chamber is an appropriate pressure in the range of an extremely low pressure to a high pressure (for example, 0.1 to 100 Pa) for improving the controllability of the profile obtained as a result of machining, although it depends upon the conditions of the processing process (step), or the like. In addition, it has been demanded to make variations smaller in plasma density and pressure among various wafers or among various reactors and semiconductor manufacturing apparatuses.

As miniaturization advances, nearly equivalent process performances (characteristics such as a processing rate and machining precision) are obtained among respective reactors in a plurality of semiconductor manufacturing apparatuses by optimizing the processing conditions in respective reactors equipped in respective apparatuses corresponding to demanded specifications; however, the processing conditions, that is, the so-called processing recipes must be managed for every reactor and development is needed to select and determine such conditions. Furthermore, since the pattern of an exposure mask is optimized to conform to the processing conditions in an etching apparatus additionally, it is demanded to minimize the differences in conditions in processing chambers among respective reactors with high precision.

In this way, in the manufacturing line of the semiconductor devices one which yields the same performance and result when wafers according to equivalent specifications are processed at the same conditions in a plurality of reactors or a plurality of processing apparatuses is demanded. Hitherto, therefore, improvement of precision in dimensions and arrangements of components which constitute reactors and management for adjusting the performance and characteristics of the respective reactors to bring them into desired ranges have been conducted.

When miniaturization of semiconductors has further advanced as in recent years, however, a further high precision is demanded on management of individual parts and performance management. For further improving the precision of dimensions of parts and arrangement distances, however, a longer time and a higher cost as compared with the present time will be needed, resulting in a hampered rate of operation and running cost of the apparatus. On the other hand, if the precision of them is not sufficient, differences in the aforementioned dimensions and distances and the differences in processing characteristics and profiles and dimensions obtained as a result of machining wafers become large among different reactors when a semiconductor manufacturing apparatus or reactors are assembled, and they depart from desired process specifications.

In conventional techniques of the etching apparatus, various contrivances have been made to obtain stable plasma having high reproducibility which is needed to solve such problems. For example, in JP-A-7-065993, it is disclosed that one which detects light emission from plasma and acquires data at periods of a high rate (in the range of 100 Hz to 10 MHz) and controls a microwave stub tuner to minimize the change of the light emission in time in order to obtain stable plasma. In addition, in JP-A-2004-281442, in order to obtain the same etching performance repetitively a plasma processing apparatus which controls microwave power to cause a bias voltage applied to a wafer to always take a minimum value is disclosed.

Furthermore, in JP-A-2001-110784, a plasma processing apparatus which estimates the conditions in a processing chamber and adjusts the operation of the plasma processing apparatus to attain desired conditions based on a process model acquired in advance from a spectrum at a specific wavelength which is obtained by detecting light emission from plasma is disclosed. Incidentally, in Mineo Furuse et al., Japanese Journal of Applied Physics, Vol. 36, pp. 4617-4619, a technique of installing a probe within a processing chamber, detecting electric field intensity distribution in a space where plasma is generated, and detecting a change of characteristics of the plasma is disclosed.

SUMMARY OF THE INVENTION

In order to achieve efficient manufacturing in a semiconductor manufacturing line in which one process is conducted by a plurality of reactors, processings in which the same processing conditions are used with the same precision in devices for the same process are desired as described in "BACKGROUND OF THE INVENTION." However, the ranges into which variations of dimensions, arrangements, and distances of components should be suppressed in order to bring the difference in performance within desired ranges among respective reactors constituting of a semiconductor processing apparatus has also become extremely small with size corresponding to miniaturization of semiconductors in recent years and its implementation has become more difficult; there is a fear that an attempt to implement it would seriously hamper the processing efficiency and running cost of the apparatus.

In addition, in order to obtain the same performance or processing results among processing apparatuses or reactors as described in aforementioned JP-A-7-065993, JP-A-2004-281442, and JP-A-2001-110784 it is known to adjust or calibrate the operations of the apparatuses or the reactors by feeding back results which are obtained by detecting conditions and states during their operations with detectors disposed in them. According to these conventional techniques, however, it is very difficult to conduct adjustment to bring all parameters of operating conditions (such as, for example, gas flow rates, pressures, and radio frequency power) which determine the processing condition within desired ranges. In addition, as disclosed in, for example, JP-A-2004-281442, even though the control at a minimum value of the bias voltage applied to the wafer is effective to specific processing, according to study made by the present inventors knowledge is obtained that it is not always valid.

In this way, in the conventional techniques, sufficient attention is not paid to the fact that the yield and efficiency of processing are hampered because it is difficult to obtain the same processing results with respect to wafers of the same kind in a semiconductor processing apparatus or among a plurality of reactors.

An objective of the present invention is to provide a plasma processing apparatus or a processing method capable of reducing the difference of the state in the processing chamber or of the plasma among a plurality of semiconductor processing apparatuses or reactors by adjusting radio frequency power introduced into the reactors to generate plasma.

The objective described above is achieved in a plasma processing apparatus including at least one reactor, each reactor including: a processing chamber disposed within a vacuum vessel; a sample stage disposed in the processing chamber and on which a wafer having a film to be processed on a surface thereof is placed; a device for supplying an electric field into the processing chamber from above to form plasma in the processing chamber; and an exhaust port for exhausting gas in the processing chamber, the wafer being processed by using the plasma while power from a radio frequency power supply being supplied to electrodes disposed in the sample stage via a matching box, by matching a specific value of the power at which values of data of at least two kinds among characteristic data including light emission intensity of the plasma, magnitude of time variation of the light emission intensity of the plasma, a matching position of the matching box, and a change of a value of a voltage of the radio frequency power supplied to the electrodes with respect to a value change of the power detected by varying power of the electric field to a plurality of values during the processing make abrupt transition with the specific value detected by using the characteristic data which is detected during the processing executed on a wafer which is the same in kind as the wafer in a different reactor.

Furthermore, it is achieved in a plasma processing apparatus including: at least one reactor; each reactor including: a processing chamber disposed within a vacuum vessel; a sample stage disposed in the processing chamber and on which a wafer having a film to be processed on a surface thereof is placed; a first power supply for forming an electric field supplied into the processing chamber from above to form plasma in the processing chamber; and an exhaust port for exhausting gas in the processing chamber; and a second power supply to supply radio frequency power to electrodes disposed in the sample stage via a matching box during processing of the wafer, the wafer being processed by using the plasma, by matching a specific value of power from the first power supply at which values of data of at least two kinds among characteristic data including a light emission intensity of the plasma, magnitude of time variation of the light emission intensity of the plasma, a matching position of the matching box, and a change of a value of a voltage of the radio frequency power supplied to the electrodes with respect to a value change of the power detected by varying power from the first power supply to a plurality of values during the processing make abrupt transition with the specific value detected by using the characteristic data which is detected during processing executed on a wafer which is the same in kind as the wafer in a different reactor.

In addition, it is achieved by the fact that the electric field supplied into the processing chamber to form the plasma is a microwave electric field.

Furthermore, it is achieved by the fact that the different reactor is a reactor installed in a different plasma processing apparatus.

Other objects, features, and advantages of the invention will become apparent from the following description of the embodiments of the invention taken in conjunction with the accompanying drawings.

Figure 1:
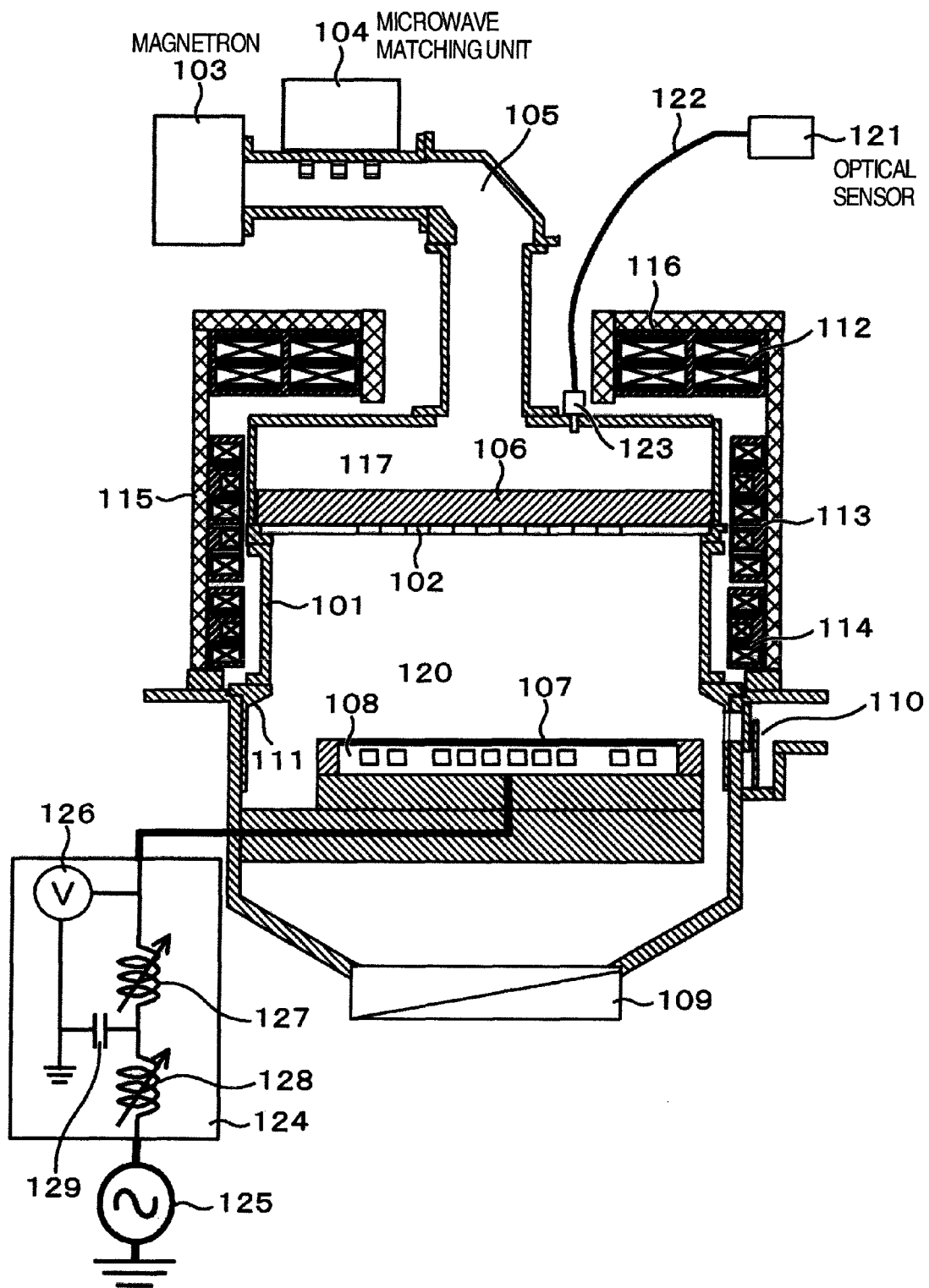
FIG. 1 is a longitudinal sectional view showing a schematic configuration of a plasma processing apparatus according to a first embodiment of the present invention.
Figure 7:
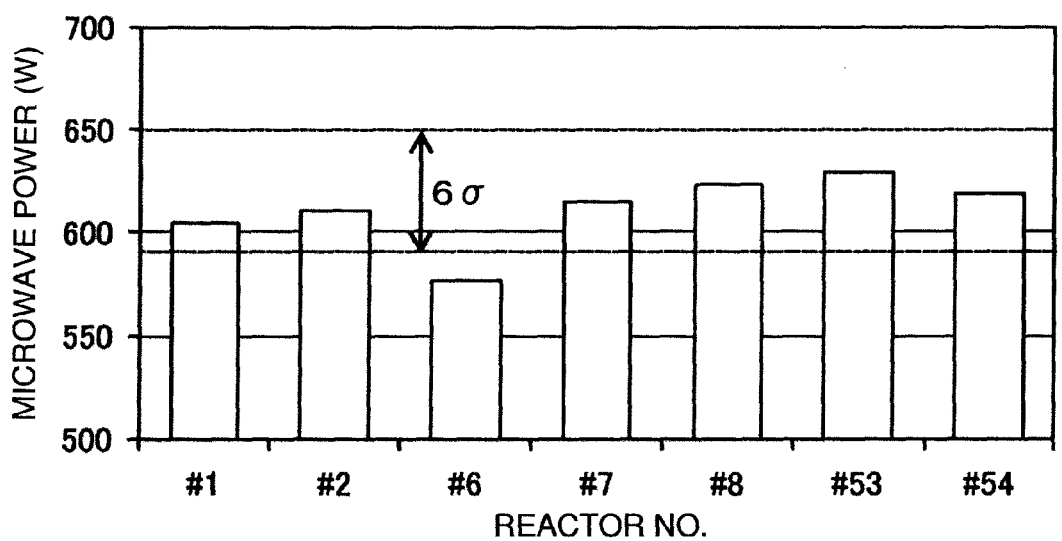
Figure 8:
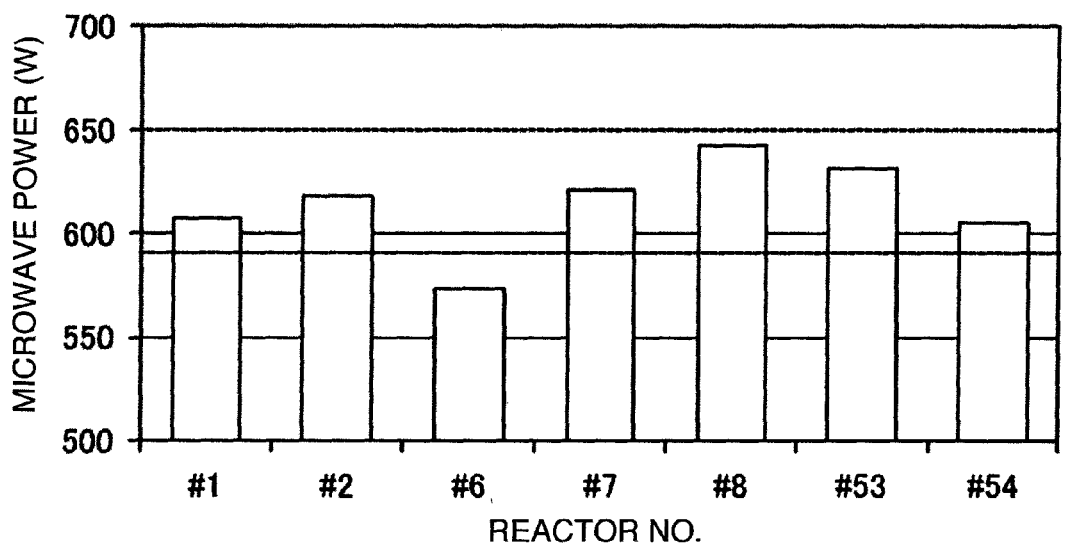
Figure 9:
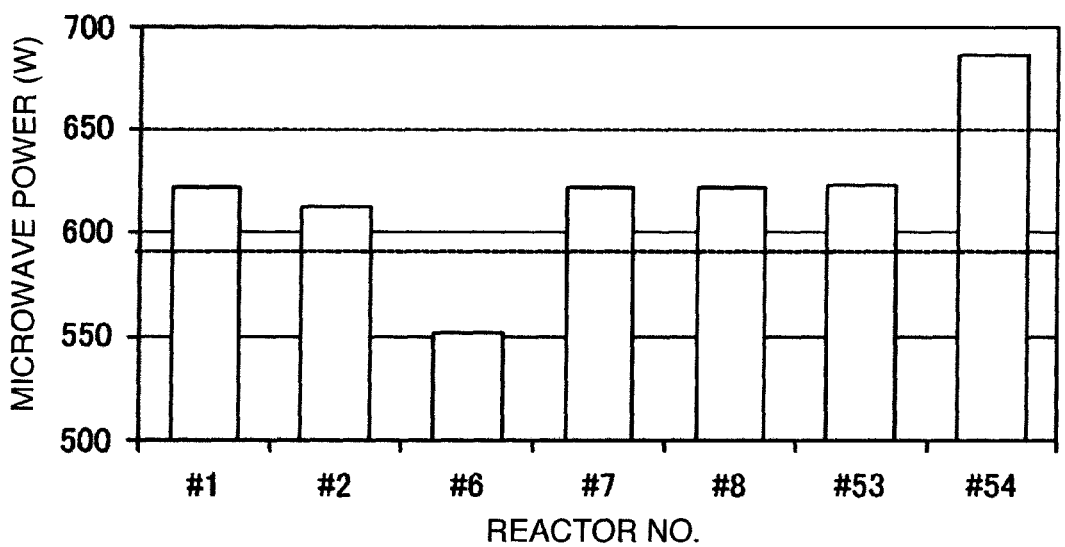
Figure 10:
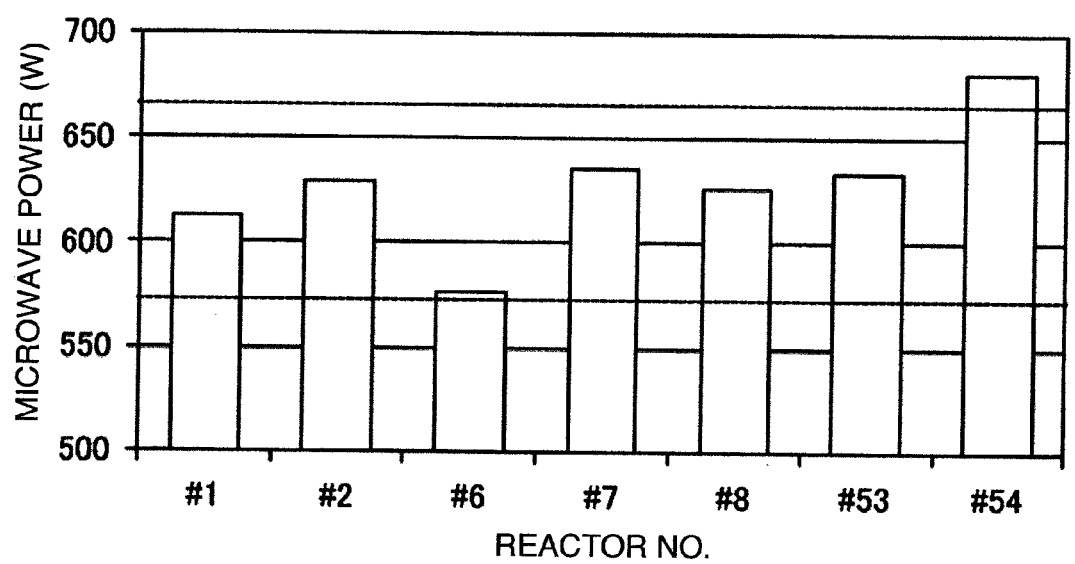
Figure 11:
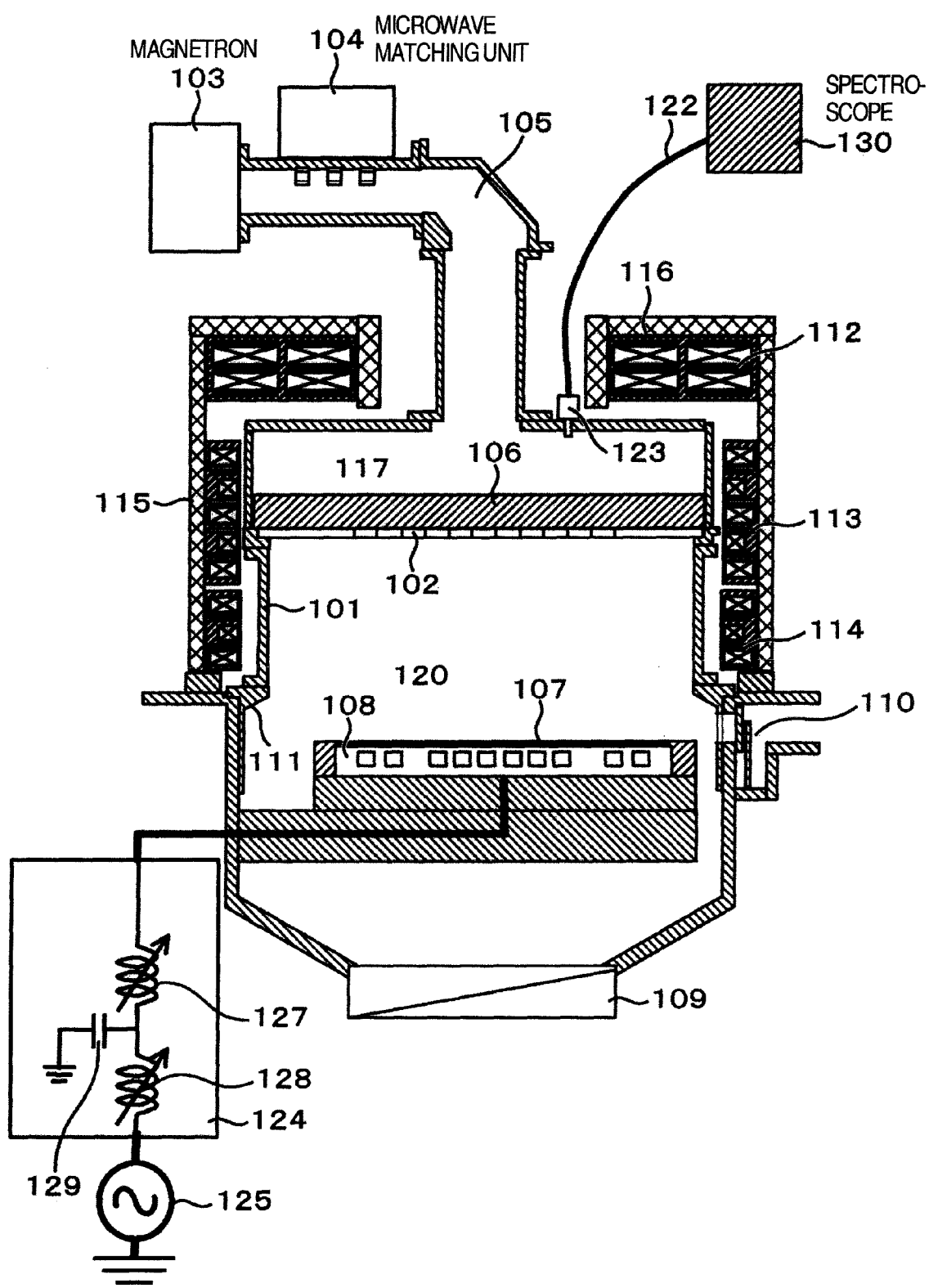
Figure 12:
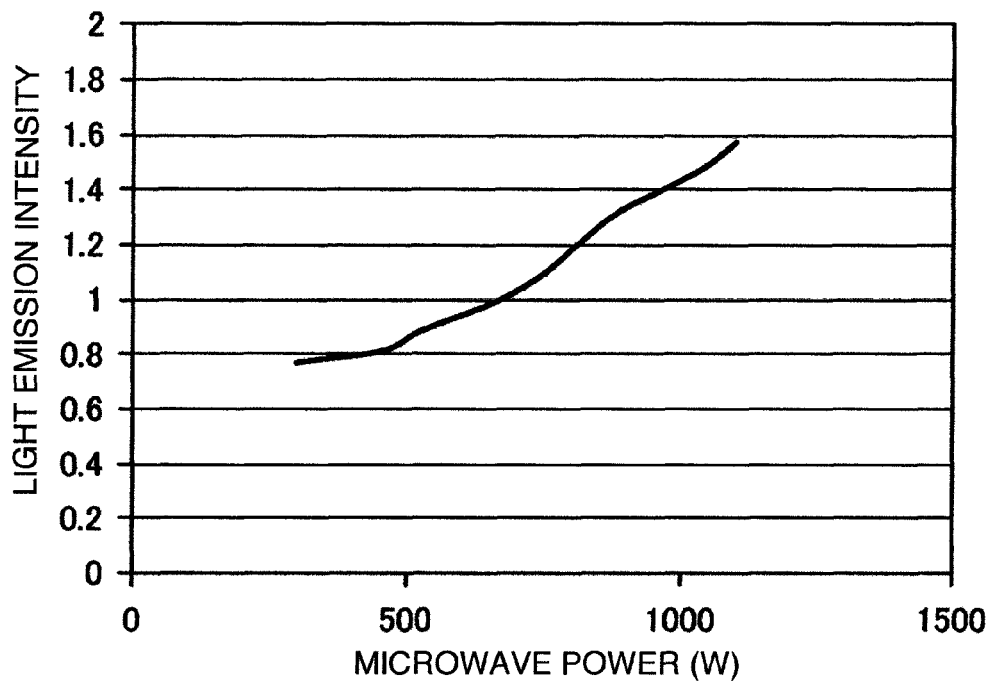
Figure 13:
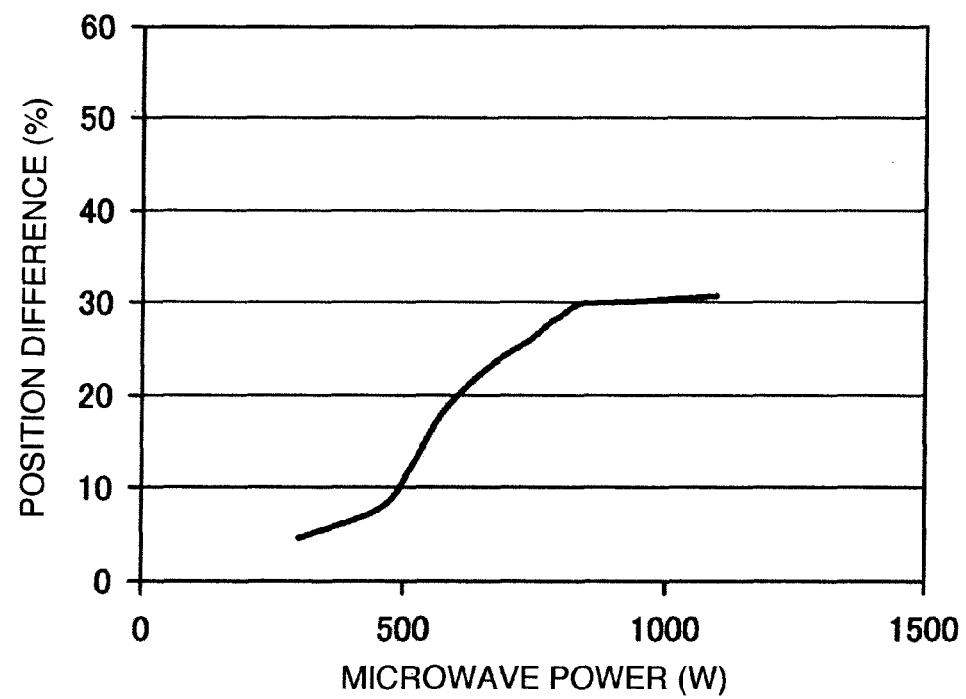
Figure 14:
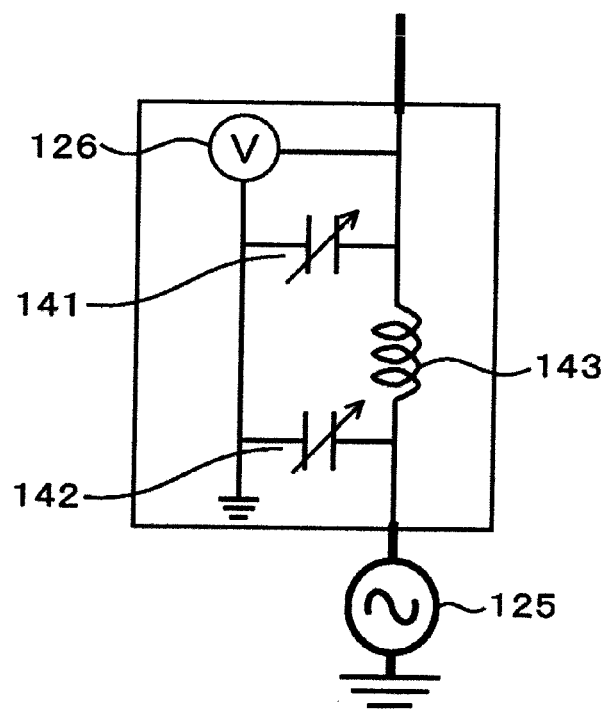
Figure 15:
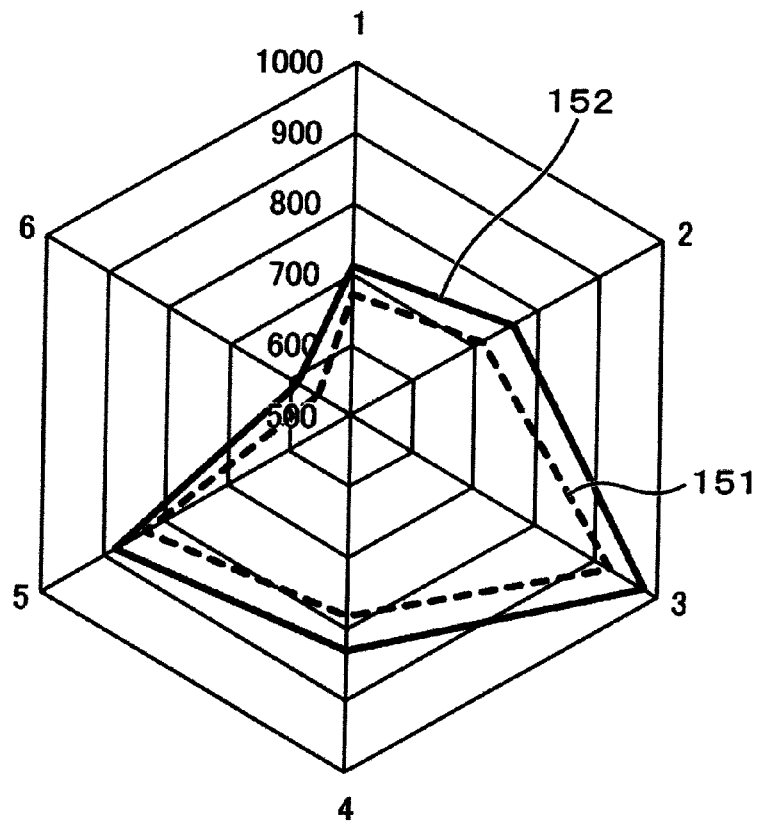

obtained from the light emission intensity of the plasma in the embodiment shown in FIG. 1;

FIG. 7 is a graph showing microwave power at transition points (discontinuous points) of a plurality of reactors obtained from the light emission intensity of the plasma in the embodiment shown in FIG. 1;

FIG. 8 is a graph showing microwave power at transition points (discontinuous points) of a plurality of reactors obtained from the variation of the light emission intensity of the plasma in the embodiment shown in FIG. 1;

FIG. 9 is a graph showing microwave power at transition points (discontinuous points) of a plurality of reactors obtained from the variable inductance positions in the embodiment shown in FIG. 1;

FIG. 10 is a graph showing microwave power at transition points (discontinuous points) of a plurality of reactors obtained from the radio frequency voltage in the embodiment shown in FIG. 1;

FIG. 11 is a longitudinal sectional view showing a schematic configuration of a plasma processing apparatus according to a modification of the embodiment shown in FIG. 1;

FIG. 12 is a graph showing dependence of light emission intensity of plasma upon microwave power in the modification shown in FIG. 11;

FIG. 13 is a graph showing dependence of a difference between two variable inductance positions upon microwave power in the modification shown in FIG. 11;

FIG. 14 is a diagram schematically showing another example of a matching box using variable capacitors included in the embodiment shown in FIG. 1 and the modification shown in FIG. 11; and FIG. 15 is a chart showing microwave power at transition points in the embodiment shown in FIG. 1.

DESCRIPTION OF THE EMBODIMENTS

In an etching apparatus using plasma, a radio frequency and processing gas are introduced into a vacuum processing chamber to generate plasma. A pattern formed on the wafer surface is machined by using the generated plasma. Although there are various plasma generation methods, a contrivance for efficiently accelerating or restraining the motion of electrons in a certain space by using an electromagnetic field is implemented to generate plasma efficiently. When the plasma density (electron density) is low, the radio frequency is absorbed gradually into the plasma from an introducing unit of a vacuum apparatus in plasma generation using radio frequency electric field introduction. As the radio frequency power is increased and the plasma density is increased to a certain value, it becomes impossible for the radio frequency to intrude into the plasma. The density at which it becomes impossible for the radio frequency to intrude into the plasma is called a cutoff and it depends upon the frequency of the radio frequency and the electron temperature. In order to increase the density greater than the cutoff, a contrivance for coupling the electromagnetic field with the electron motion is needed. For example, there are acceleration of electrons using an induction electric field, acceleration of electrons using electron cyclotron resonance, and the like.

In this way, there is a difference in mechanisms in which plasma is generated between at plasma densities up to the cutoff and at plasma densities exceeding the cutoff. When the introduced radio frequency power is increased, therefore, the plasma generation mechanism changes in the vicinity of the cutoff. According to, for example, Mineo Furuse et al., Japanese Journal of Applied Physics, Vol. 36, pp. 4617-4619, such a change of the plasma is grasped clearly by measuring the electric field intensity distribution in the plasma generating space. When such a change occurs, then the light emission intensity of the plasma, the bias voltage applied to the wafer, and matching points of the radio frequency matching mechanism may become discontinuous at densities near the cutoff or slopes of power dependences may be inflected. At this discontinuity (or inflection point), even in different reactors the density always become the same as long as the processing conditions (such as gas and pressure) are the same. This discontinuous point may be called a transition point.

When there is no difference between reactors, the discontinuous points described above are produced at the same radio frequency power as long as the processing conditions are the same. In the present embodiment, therefore, it is attempted to solve the problem by using the characteristic that the density becomes the same at the discontinuous point, thereby detecting the difference between apparatuses quantitatively and calibrating the difference.

However, this discontinuous point needs the conditions that the plasma density should be made to the cutoff or higher and, because of constraints of the apparatus (such as maximum power of the radio frequency power supply), detection of the discontinuous point needs certain conditions such as that it should be in a low gas pressure region (in the range of approximately 0.1 to 4 Pa) or a gas species which tend to ionize should be used. Furthermore, the discontinuous point often appears in the light emission intensity of the plasma or the wafer bias voltage but there may be cases where a large change is not seen between before and after the cutoff and the detection is difficult. For example, in the case of light emission, there is a case where a distribution changes between before and after the cutoff but the light emission intensity increases monotonously at a measurement point. Furthermore, in the case of the bias voltage, there is a case where the impedance of the plasma changes between before and after the cutoff but the change is small or it cannot be detected as voltage discontinuity in association with the phase.

Such failures in the detection of a discontinuous point depends upon what sort of sensor is used for the detection. If a probe is introduced into the apparatus and plasma of a whole reactor is observed by using a device as in Mineo Furuse et al., Japanese Journal of Applied Physics, Vol. 36, pp. 4617-4619, then, there is a possibility that sensing will be able to be conducted securely. In an etching apparatus used for semiconductor manufacturing, however, there are provided with a stage (electrode) for wafer processing, a temperature adjustment mechanism, a radio frequency bias application mechanism, and the like and it is difficult to use such a device as described in Mineo Furuse et al., Japanese Journal of Applied Physics, Vol. 36, pp. 4617-4619. Although probe devices other than this exist, it is difficult to grasp the plasma state three-dimensionally in an apparatus for semiconductor manufacturing or a special expensive configuration is needed to implement.

Typically, a sensor incorporated in an apparatus measures an accumulated value of a certain plasma state in a certain direction in the apparatus. For example, an optical sensor installed on a side face of the apparatus measures an accumulated value of a plasma light emission amount in a radial direction at a certain height position. Since such an accumulated value is measured, there are cases where an individual sensor cannot grasp a change. In the present embodiment, therefore, a plurality of detection devices which are different from each other in a physical phenomenon to be detected are used together to detect such discontinuity. For example, in addition to the light emission intensity and the wafer bias voltage, at least two devices out of the variation (time variation) of the light emission intensity of the plasma in time, the matching point of the radio frequency bias applied to the wafer (positions of variable inductors), and the like are used together to prevent a detection error and solve the aforementioned problem.

For preventing a detection error and detecting a discontinuous line (transition points) efficiently, it is desirable that a plurality of measurement devices are structurally independent. The etching apparatus has a concentric circle structure and the generated plasma has a structure which is nearly symmetrical about a center axis. Therefore, it suffices that there are devices for grasping a distribution in the radial direction of the apparatus and a distribution change in the height direction independently. In addition, in the vicinity of the cutoff, there may be cases in which the states that the electron density is increased by entrance of the radio frequency electric field, the high electron density prevents the entrance of the radio frequency electric field, and it results in a lowered density are repeated. In other words, discontinuity in the vicinity of the cutoff is represented by a change of characteristics such as the density or intensity of the plasma in the radial direction or the height direction in the space and a time variation of the distribution of the plasma density and, if these can be detected independently, it becomes possible to detect a discontinuous point securely.

The plasma state refers to the electron density, the electron temperature, and a temporal fluctuation of the electron density. Light emission is light emission intensity of the plasma accumulated linearly from an installation position and reflects roughly an average electron density. The light emission variation is a fluctuation of the electron density and it grasps a variation of plasma generation accompanied with a short time variation of radio frequency electric field propagation. The impedance with respect to the bias frequency is a path integral of the impedance from the wafer to the reactor inner wall face which can become ground and it is reflected upon the position of a variable inductance or the output voltage of a matching box of the bias radio frequency. In particular, whereas the light emission intensity is an integration value on a certain straight line, the impedance of the radio frequency applied to the wafer is mainly determined by a straight line directed to the wafer and the inner wall face (a ground part). Since the inner wall face serving as ground is ground for the radio frequency, the surface need not be metal but may be covered by a thin insulator. If the wafer and the ground position for the radio frequency differ from the measurement direction of the light emission intensity structurally, the measurement can be handled in a complementary way because they have independent directional components. Since independent events in the plasma at a discontinuous point is constituted of three kinds of the radial direction, the height direction, and the time variation as described earlier, the detection error can be prevented when the height direction is measured with the light emission intensity, the radial direction is measured with impedance, and the time variation is measured with a light emission variation. Although measurements of the three kinds are more preferable, however, the time variation handled here is a sufficiently fast change as compared with the process time and from the viewpoint of the machine difference it may be sufficient to detect a discontinuous point in the radial direction and the height direction.

In this way, there is a possibility that the power difference of the radio frequency power introduced effectively into the reactor may be able to be detected from the discontinuous point. In addition, the radio frequency power at the discontinuous point caused by the cutoff depends upon the processing conditions. In the present embodiment, therefore, the difference of the effectively introduced radio frequency power is made clear by preparing a plurality of processing conditions in advance which differ in radio frequency power at the discontinuous point and conducting measurement in every apparatus. In other words, it is made clear whether power shift occurs (difference in an intercept) or the difference in effective power is large as the power becomes high (difference in a slope).

As for the adjustment of the effective power, the problem is solved by obtaining the differences of the intercept and the slope in advance and introducing them into the apparatus as adjustment parameters.

EMBODIMENTS

Hereafter, a first embodiment of the present invention is described with reference to FIGS. 1 to 10.

FIG. 1 is a longitudinal sectional view showing a schematic configuration of a plasma processing apparatus according to the first embodiment. The plasma processing apparatus according to the present embodiment includes a vacuum vessel, a waveguide installed over it, a plasma forming device such as a coil, and a vacuum pump which is disposed under the vacuum vessel to connect to it and which is not illustrated. Within the vacuum vessel, there are disposed a vacuum processing chamber 120 in which plasma is formed and a plate-shaped microwave introducing window 106 having a substantially circle shape disposed over the vacuum processing chamber 120 to cover it and formed of a material which transmits an electric field such as quartz. The vacuum processing chamber 120 is surrounded with its side periphery by a reactor 101 and a lower reactor 111.

Over and on the side periphery of outside of the vacuum chamber 120, three solenoid coils 112, 113 and 114 and yokes 115 and 116 made of iron are disposed. A bottom face of the microwave introducing window 106 forms a ceiling face of the vacuum chamber 120 and its top face is connected to a microwave waveguide 105 to form a bottom face of a resonator 117 in which a microwave introduced into an internal space of a substantially cylindrical shape is resonated.

A circular or ring-shaped plate member which forms a ceiling face of an internal space of an upper part of the resonator 117 is connected to the microwave waveguide 105 and their insides are communicated with each other. The axial direction of the microwave waveguide 105 changes from a vertical direction to a horizontal direction as from a lower end part to an upper end part and the ends of respective conduits of the vertical direction and the horizontal direction are connected to each other so that the insides are communicated and the microwave can be propagated the inside of the conduits. A microwave matching unit 104 and a magnetron 103 are installed on the conduit of the microwave waveguide 105 and a microwave having a predetermined frequency (2.45 GHz in the present embodiment) oscillated and formed by the magnetron 103 is conditioned by the microwave matching unit 104, propagated in the microwave waveguide toward its lower end part, and introduced into the resonator 117. The microwave resonated with a predetermined frequency in the resonator 117 is transmitted by the microwave introducing window 106 and a shower plate 102 disposed underneath and introduced into the vacuum processing chamber 120.

Under the space in which plasma in the vacuum processing chamber 120 is formed a processing stage 108 on the top of which a wafer serving as a sample mounted and retained and which has the shape of substantially a cylinder or a disk is disposed and a space between the side wall portion of its periphery and a side wall of the reactor 101 having the shape of a cylinder similarly becomes a space through which the plasma and gas products in the space where the plasma is formed move and flow to underneath of the processing stage 108.

Furthermore, electrodes formed of conductive members such as metal are disposed in the processing stage 108 and radio frequency power to form a bias potential over the wafer placed on the processing stage 108 is applied. In addition, in the processing stage 108 a base material made of metal having a shape of a disk is disposed and a temperature adjustment mechanism is disposed having a plurality of passages disposed within the base material in a concentric circular or helical form within which a coolant for cooling the base material, the processing stage 108, or the wafer 107 flow or having a heating device such as a heater. Further, on a top face of the processing stage 108 a circular film made of a dielectric incorporating a plurality of film-shaped electrodes made of conductors therein is disposed to form an electrostatic chuck so that the wafer 107 is adhered and retained by static electricity by applying power to the internal electrodes in a state in which the wafer 107 is mounted on the dielectric film forming a face on which the sample is placed.

The plasma processing apparatus according to the present embodiment is connected to a vacuum transfer vessel which is not illustrated and a vacuum transfer chamber in the vacuum transfer vessel and the vacuum processing chamber are opened/closed and sectioned by a valve 110 in a transfer port. Prior to processing in the vacuum processing chamber 120, as being placed on an arm included in a transfer robot which is disposed in the vacuum transfer chamber and not illustrated, the wafer 107 is transferred in the vacuum transfer chamber which is reduced in pressure accompanied by operation of the vacuum robot and the arm, passes through within the transfer port opened by the valve 110, is transferred to above the processing stage 108, and is delivered to the processing stage 108. After the transfer robot exits the vacuum processing chamber 120, the valve 110 closes the transfer port and processing on the wafer 107 is started. After the processing is finished, the wafer 107 is delivered again to the transfer robot which has entered the transfer port opened by the valve 110 and a different wafer which is before processing is transferred in.

Under the microwave introducing window 106, a shower plate 102 made of quartz is disposed, which is disposed to oppose to the vacuum processing chamber 120 and the mounting surface of the processing stage 108. Gas for processing is introduced into a space between the shower plate 102 and the microwave introducing window 106 through a pipeline connected to a gas source which is disposed outside the vacuum vessel constituting the plasma processing apparatus; the processing gas introduced into the space is introduced into the vacuum processing chamber 120 from the above through a plurality of through holes disposed in a region which includes a central part of the shower plate 102 and located over the processing stage 120 opposing thereto.

An opening for exhausting gas, plasma, products and the like inside the vacuum processing chamber 120 to the outside is disposed in a lower part of the vacuum vessel located right under the processing stage 108 and this opening communicates with an inlet of a vacuum pump which is disposed under the vacuum vessel and is not illustrated via an exhaust passage. Under the opening and between the opening and the vacuum pump a pressure adjustment valve 109 in which a plurality of plate-like flaps rotate to increase or decrease the opening cross section area of the passage is disposed and a flow rate of the exhaust from the vacuum processing chamber 120 is adjusted by increasing or decreasing the opening caused by rotation of the flap.

When conducting processing (etching processing) on the wafer 107 in such a plasma processing apparatus, gas for etching is introduced from the through holes of the aforementioned shower plate 102 into the vacuum processing chamber 120. The pressure in the vacuum processing chamber 120 is adjusted to be in a range of a desired value by a balance of a flow rate of gas introduction and a flow rate of gas exhaust by operation of the pressure adjustment valve 109 and the vacuum pump.

Once it is detected that a pressure suitable for processing is reached by using a pressure sensor which is not illustrated, an electric field of approximately 2.45 GHz is formed by the magnetron 103, adjusted by the microwave matching unit 104, propagated through the passage within the microwave waveguide 105, and introduced into the vacuum processing chamber 120 via the resonator 117 and the microwave introducing window 106. In addition, a DC current is applied to the solenoid coils 112, 113, and 114 and the coil current is adjusted to form a magnetic field in which a part within the vacuum processing chamber 120 becomes approximately 875 Gauss. In this way, the gas introduced into the vacuum processing chamber 120 is excited by the electric field formed by the microwave and the magnetic field formed by the coils and converted to plasma to generate plasma in the vacuum processing chamber 120.

Before the discharge of the plasma, the wafer 107 is transferred and retained on the processing stage 108 as described above. The temperature adjustment mechanism is driven to bring the wafer 107 into a range of temperature suitable for processing in this state. The processing stage 108 in the present embodiment is configured to make it possible to adjust a central part and a peripheral part of the wafer to different temperatures; for obtaining a desired temperature profile (temperature distribution in a plane direction of the wafer 107 or the mounting surface of the processing stage), however, adjustment is conducted under a condition that the temperature difference between the central part and the peripheral part during processing should be approximately 40° C. or less.

Furthermore, in the state in which the wafer 107 is retained on the mounting surface, He is introduced from an opening communicating with an inside of a pipeline which is disposed on the dielectric film and not illustrated into a space between a rear face of the wafer 107 and the dielectric film (the electrostatic chuck) of the processing stage 108 as a heat transfer gas for promoting heat transfer between the two. On the surface of the wafer 107 a structure of a plurality of film layers including a film to be subject to etching machining is disposed in advance and, as examples of such film layers, there are a case where a mask pattern is transcribed to a resist material serving as a mask and a case of a Si wafer having no mask pattern.

In the present embodiment, radio frequency power in the range of 200 kHz to 30 MHz is applied to the electrodes within the processing stage 108 nearly simultaneously with firing of plasma or earlier by a predetermined time than firing of plasma. This radio frequency electric field is introduced by a coaxial cable from a radio frequency power supply 125 connected electrically to the electrodes via a matching box 124 including a first variable inductor 127, a second variable inductor 128, and a capacitor 129.

A bias electric field is formed over the wafer 107 by radio frequency power supplied to the electrodes in the processing stage 108 and charged particles such as ions in plasma are attracted to the surface of the wafer 107 by a potential difference with the plasma so that a film to be processed is subject to etching processing. In this way, a thin film is machined on the wafer 107. The wafer 107 of the present embodiment has a diameter of approximately 300 mm.

In the present embodiment, during the processing of the wafer 107, parameters indicating processing conditions such as the light emission intensity of the plasma, the variation of the light emission, the variable inductor positions in the matching box, and a voltage of the radio frequency power applied to the electrodes (radio frequency voltage) are detected at predetermined intervals, for example, every 0.1 sec. In the plasma processing apparatus according to the present embodiment, an optical sensor 121, position sensors for the first variable inductor 127 and the second variable inductor 128, and a voltmeter 126 are disposed for such detection.

The optical sensor 121 is connected by an optical fiber 122 with a measurement port 123, which is inserted into a ring-shaped plate member forming a ceiling face of the resonator 117 from outside, attached, and retained to receive light from the inside of the vacuum processing chamber 120 via the shower plate 102 and the microwave introducing window 106 which are light transmitting members. If a light emission variation of a short period of time of approximately 1 msec is not measured, the optical sensor 121 may also be replaced with a spectroscope.

In the present embodiment, the microwave power is gradually changed at selected processing conditions while a wafer having a predetermined shape is mounted on the processing stage 108. Prior to processing of the wafer 107, the inside of the vacuum processing chamber 120 is subject to cleaning and heating at certain conditions. For example, in addition that inert gas such as Ar is introduced to form plasma to evaporate deposits deposited on the surface of the inside of the vacuum processing chamber 120 facing the plasma, the inside surface of the reactor 101 fronting the vacuum processing chamber 120 is heated by an interaction with the plasma.

Next, $Cl_2$ gas, HBr gas, and $O_2$ gas are introduced from the shower plate 102 as processing gas at flow rates of 100 ml/min, 20 ml/min, and 5 ml/min, respectively and the pressure in the vacuum chamber 120 is adjusted to 0.3 Pa. In addition, DC power is supplied to the solenoid coils 112, 113, and 114 to form a magnetic field and the DC power is adjusted to cause the magnetic field intensity at a height of 170 mm from the center of the wafer 107 to become approximately 875 Gauss. Furthermore, a microwave of 600 W is generated by the magnetron 103 and introduced into the vacuum processing chamber 120 to excite the processing gas and to generate plasma over the processing stage 108 in the vacuum processing chamber 120.

In the present embodiment, 0.1 sec earlier than the introduction of the microwave, a radio frequency of 400 kHz and 100 W is applied to the processing stage 108. After discharge is conducted for approximately 10 sec, the power of the microwave is set to 300 W and the power is raised by 10 W every 2 sec up to 1,100 W; then the processing is finished. The first discharge with 600 W for approximately 10 sec is introduced to avoid instability in the early stage of firing and secure reproducibility of data. Also, data measured with microwave power successively raised is referred to as discharge characteristic data.

Figure 2:
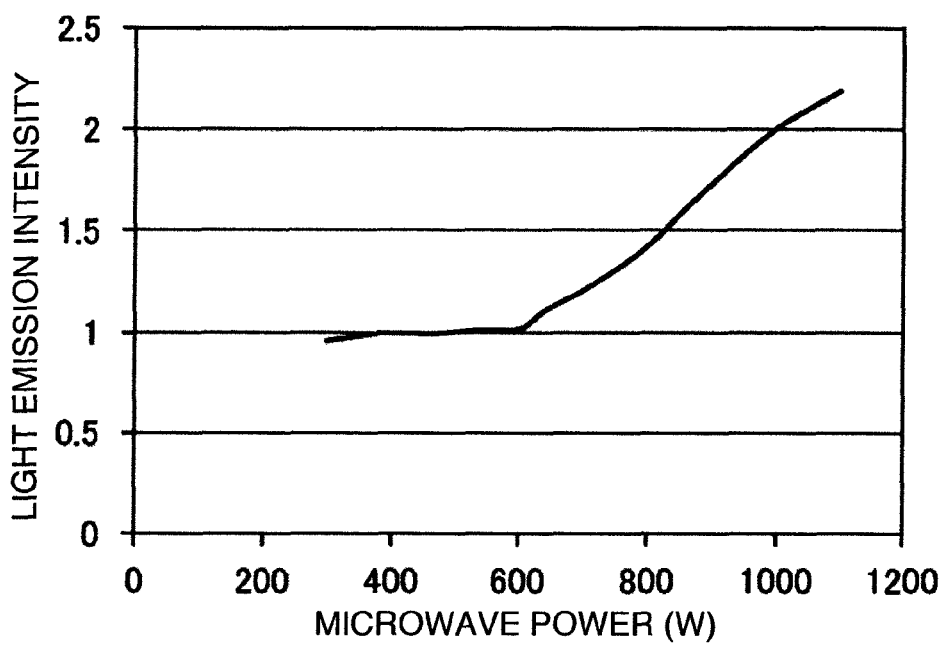
FIG. 2 is a graph showing dependence of light emission intensity of plasma upon microwave power in the embodiment shown in FIG. 1.
Figure 3:
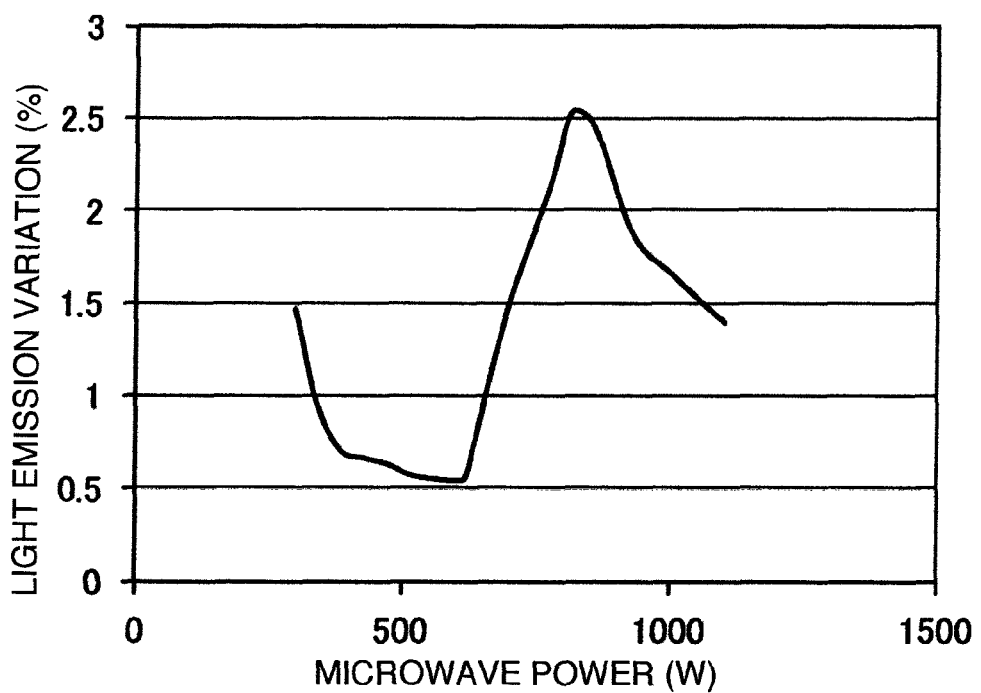
FIG. 3 is a graph showing dependence of a variation of the light emission intensity of the plasma upon microwave power in the embodiment shown in FIG. 1.

The discharge characteristic data of the light emission intensity of the plasma, the magnitude of the variation of the light emission intensity with time elapse, the positions VL1 and VL2 of the variable inductors, and the voltage obtained by detecting the aforementioned discharge characteristics in the plasma processing apparatus according to the present embodiment are shown as graphs in FIGS. 2, 3, 4, and 5, respectively. Here, the light intensity shown in FIG. 2 is an average value for 1.5 sec and the light emission variation shown in FIG. 3 is a standard deviation of light emission data of an accumulation time of 0.1 msec with 20 msec intervals. In these, the values of power of the microwave supplied to the inside of the vacuum processing chamber 120 during the processing described above are indicated on the abscissa and along with its change the light emission intensity of the plasma, the magnitude of the change of the light emission intensity of the plasma in time, differences of the positions of a plurality of variable inductors, and a change of the voltage value of the radio frequency power supplied to the processing stage 108 are indicated as lines.

It is appreciated that there is an inflection point around 620 W in the example shown in any figures. From a different measurement of plasma it is found that the plasma density in the plasma generation area around 620 W is a cutoff density (approximately $1 \times 10^{11}/cm^3$) of approximately 2.45 GHz in a study made by the present inventors.

In the light emission intensity shown in FIG. 2, the light emission intensity rises abruptly at 620 W or more. It is considered that this is because the distribution of the plasma changes and microwave absorption in a position where the optical sensor is installed increases.

The variation of the light emission intensity shown in FIG. 3 increases at 620 W or more and then decreases later. In the vicinity of the cutoff, if the density becomes high, propagation of the microwave is suppressed and the absorption efficiency decreases. When it decreases, the density of the plasma becomes lower and consequently absorption of the microwave into the plasma enhances and the density of the plasma increases; since these are repeated, the variation becomes large.

In this figure, the variation is also large in the vicinity of 300 W and it is considered that this is because microwave power required to maintain the discharge over the whole space is insufficient. In the vicinity of 620 W the distribution of the plasma changes and the impedance of the plasma space also changes.

Figure 4:
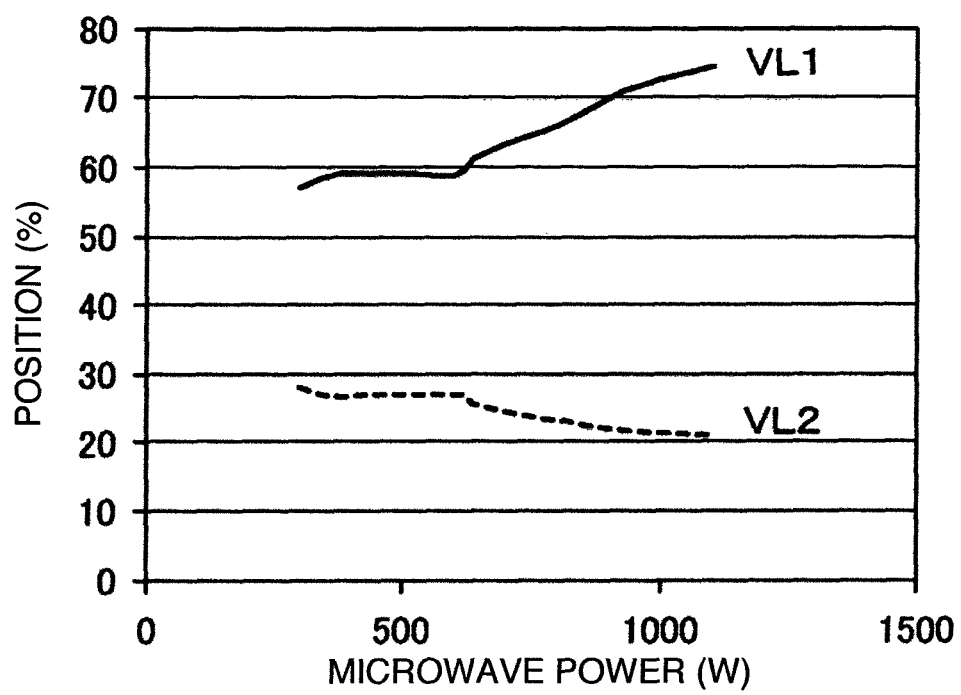
FIG. 4 is a graph showing dependence of variable inductance positions upon microwave power in the embodiment shown in FIG. 1.
Figure 5:
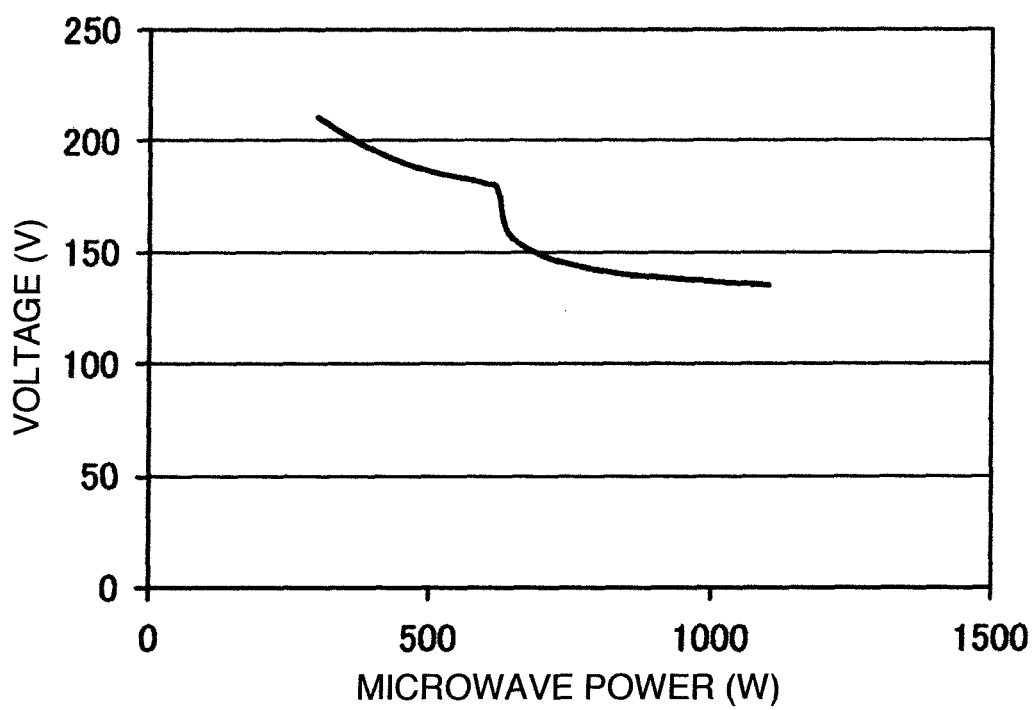
FIG. 5 is a graph showing dependence of a radio frequency voltage upon microwave power in the embodiment shown in FIG. 1.

The voltage of the radio frequency electric field applied to the processing stage 108 changes as shown in FIG. 5 and matching points of the variable inductors 127 and 128 in the matching box 124 also change as shown in FIG. 4 due to the change of the impedance. Both become discontinuous at 620 W.

Next, discharge characteristic data of a different reactor is acquired using the same processing conditions. The transition point is found by matching points where the second-order differential becomes zero or discontinuous points of the first-order differential value in the vicinity of the central point 620 W.

Figure 6:
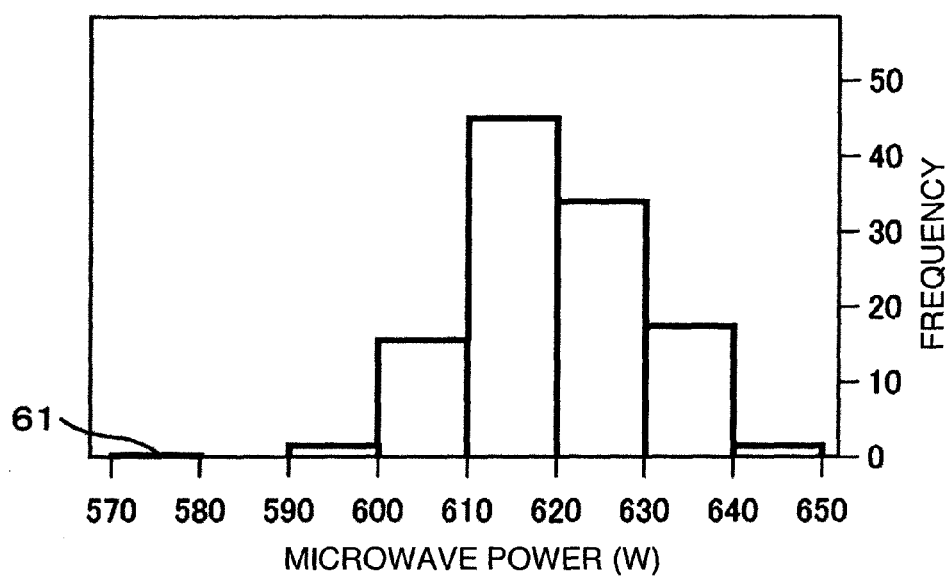
FIG. 6 is a graph showing a frequency distribution of microwave power at transition points (discontinuous points)

In FIG. 6, a frequency distribution of microwave power at transition points (discontinuous points) obtained from light emission intensity measurement of the plasma is shown. In the present embodiment, the number of reactors is set equal to 118. Generally, they distribute with a center of 620 W with a of approximately 10 W, and it is appreciated that only one point of an outlier 61 deviates. It can be judged whether it is an abnormal apparatus by using results of such detection and thereby detecting transition microwave power from the light emission intensity.

In FIGS. 7, 8, 9, and 10, power values of microwave at a transition point in each of a plurality of semiconductor processing apparatuses or reactors arbitrarily selected including a reactor containing an outlier are shown. FIG. 7 shows the light emission intensity, FIG. 8 shows the magnitude of the time variation of the light emission intensity, FIG. 9 shows the positions of the variable inductors, and FIG. 10 shows the voltage value (Vpp: peak-to-peak voltage) of the radio frequency power supplied to the processing stage 108. In FIG. 9, a value obtained by subtraction of positions of two inductors is used.

In any data, the reactor No. 6 becomes smaller by approximately 40 to 50 W in power values of the microwave at the transition points. Detection of the outlier is indicated by broken lines in the figures as widths which are six times the standard deviations of detected data values. The reactor No. 6 becomes a value (outlier) which is away from values of other reactors except for the voltage measurement (FIG. 10). The voltage measurement tends to be lower in accuracy as compared with other measurements.

In the microwave power at the transition point obtained from the variable inductor positions shown in FIG. 9, the transition point of reactor No. 54 exceeds range values of transition point detection accuracy. This is not detected in the light emission intensity and its variation shown in FIGS. 7 and 8. In addition, the reactor No. 54 becomes an outlier in FIG. 10 as well. It is considered that impedance matching has shifted due to a failure in an output part of the radio frequency power supply applying to the processing stage 108. According to a study conducted by the present inventors, it is known that the microwave power at the transition point falls within a measurement error if the power supply is replaced. In this way, a defect of a part constituting an apparatus can be detected and identified by comparing data of the transition point detected using different measurement devices.

Next, an operation for calibrating an apparatus (reactor) (the reactor No. 6 in the present embodiment) which is away from others in data and has a large machine difference is described. As for the reactor No 6 in the present embodiment, an abnormality is not found in the magnetron output and the power meter but it is predicted that variations arise in dimensions, arrangements, and distances of parts when the reactor is assembled.

A transition point of the microwave power obtained from the light emission intensity, the variation of the light emission intensity, and the variable inductor positions in the present embodiment is approximately 570 W. Since the average power of the transition point of the whole including other reactors is approximately 620 W, the transition point is lower by approximately 50 W (8%).

Therefore, a conversion table is applied to the reactor No. 6 to cause the microwave power when 570 W is applied to become 620 W when the processing conditions (recipes) are set. As for the method for conversion using the conversion table, 50 W may be subtracted from the set value but, since the origin does not move, a coefficient is multiplied in the present embodiment. In the reactor No. 6, microwave power obtained by multiplying the power which is set according to a recipe by 0.92 is introduced by such conversion and the microwave power at the transition point is made equivalent to those of other apparatuses (reactors) by this calibration.

As one example of the processing conditions of the wafer 107, the following condition is considered. When machining a polycrystalline Si film (poly-Si), $Cl_2$ gas, HBr gas, and $O_2$ gas are introduced from the shower plate 102 as processing gas at flow rates of 100 ml/min, 20 ml/min and 5 ml/min, respectively, and the pressure in the vacuum processing chamber 120 is adjusted to 0.3 Pa. By generating a microwave having a power value of 500 W in the magnetron 103 and introducing into the vacuum processing chamber 120, and further introducing a magnetic field from the solenoid coils 112, 113 and 114 into the vacuum processing chamber 120, plasma is generated.

In addition, radio frequency power of 400 kHz and 100 W is applied to the electrodes within the processing stage 108. When this condition is applied to the reactor No. 6 before calibration and the poly-Si film is machined, microwave power which is substantially higher by approximately 40 W is introduced. As a result, the etching rate is higher by approximately 5% as compared with normal reactors and in particular the machining dimension of a pattern in a wafer peripheral part (3 mm from the edges) is finished thinner by 2 to 3 nm. When the reactor No. 6 is calibrated, such a difference is eliminated and buried in measurement errors, variations of film formation, and the like and process specifications are satisfied.

It can be presumed that the light emission intensity fluctuates with a frequency which is approximately equal to the plasma frequency; since it also fluctuates with the radio frequency applied to the processing stage 108 simultaneously, however, the vibration of the applied radio frequency is measured if the accumulation time is short. Therefore, it is desirable that the accumulation time is equal to one cycle of the radio frequency or longer and in the case of 400 kHz it becomes 2.5 μsec or longer. In order to sufficiently suppress the 400 kHz vibration, the accumulation time of 25 μsec or longer is desired. On the other hand, when the accumulation time is prolonged, the light emission amount is averaged and the variation becomes small. Considering the precision of the optical sensor, detection becomes difficult if the accumulation time exceeds 0.2 sec. Experimentally, in 0.1 sec accumulation, the variation shown in FIG. 3 becomes approximately one fifth but detection is possible. Therefore, an accumulation time in the range of 25 μsec to 0.2 sec is desirable.

A modification of the plasma processing apparatus according to the embodiment shown in FIG. 1 is now described with reference to FIGS. 11 to 15. FIG. 11 is a longitudinal sectional view showing a schematic configuration of a plasma processing apparatus according to a modification of the embodiment shown in FIG. 1

In the present modification it is provided with a configuration in which a spectroscope 130 is disposed instead of the optical sensor 121 in the embodiment shown in FIG. 1. In the present modification, $Cl_2$ gas, HBr gas, and $O_2$ gas are introduced from the shower plate 102 as processing gas at flow rates of 20 ml/min, 100 ml/min, and 2 ml/min, respectively, and the pressure in the vacuum processing chamber 120 is adjusted to 0.7 Pa.

Further, a magnetic field introduced from the solenoid coils 112, 113, and 114 into the vacuum processing chamber 120 is adjusted to cause the magnetic field intensity at a height of 150 mm from the center of the wafer 107 to become approximately 875 Gauss. In addition, a microwave having a power value of 700 W is generated by the magnetron 103 and introduced into the vacuum processing chamber 120 via a microwave waveguide 105 to generate plasma. A radio frequency power of 400 kHz and 100 W is applied to the electrodes in the processing stage 108, 0.1 sec earlier than the introduction of the microwave. After plasma is formed at these conditions for approximately 10 sec, the power of the microwave generated by the magnetron 103 is set to 300 W and raised by 10 W every 2 sec up to 1,100 W; then the processing is finished. In the present modification, the spectroscope 130 detects light having a wavelength from approximately 250 to 900 nm with an accumulation time of 0.1 sec at a every resolution of 0.5 nm.

In FIG. 12, a change of the light emission intensity of the plasma obtained by accumulating a wavelength of 450 to 800 nm is shown. In the present modification, because the intensity change is large in the range of 450 to 800 nm which is a wavelength region longer than the short wavelength region, this wavelength is chosen. It is considered that such a change is because there are light emission spectra of Cl and Br in this wavelength region and there are a large number of levels excited by electron collisions.

As the power value of the microwave increases, the light emission intensity increases monotonously and, although there is something like an inflection point in the vicinity of 800 W, a discontinuous point is not detected clearly. Furthermore even when the optical sensor 121 of the plasma processing apparatus according to the embodiment is used, a discontinuous point (transition point) is not found in the same way. The reason why a discontinuous point is not detected is considered to be that, even when the plasma distribution changes, it cannot be measured noticeably from the connection position of the optical fiber.

In FIG. 13 the position difference between the variable inductors 127 and 128 in the matching box 124 at the same conditions is shown. As the microwave power increases, the difference between the variable inductor positions increases and it becomes constant after 820 W. Since the position difference changes little, it is judged that the radio frequency impedance from the wafer to ground changes little. In the plasma processing apparatus shown in the embodiment, the reactor 101 and the lower reactor 111 are electrically connected to ground outside of the vacuum vessel and the inside part (inner wall face on the vacuum side) becomes a ground electrode. The present inventors have found that at the cutoff density of the plasma or higher the plasma is absorbed up to a height of 150 mm where electron cyclotron resonance (ECR) occurs and there are no large changes in states such as plasma density or intensity in a region below a plane where ECR occurs so that the radio frequency impedance does not change consequently. In particular, it is considered that, when the pressure in the vacuum processing chamber 120 becomes high, the plasma tends to be easily absorbed on a side closer to the shower plate 102 and such a tendency becomes strong. In the vicinity of 820 W, the plasma density is nearly the cutoff density according to a different measurement and, therefore, it can be said that this point (820 W) is a discontinuous point (transition point).

Although the transition point does not become clear according to the change of the light emission intensity as shown in FIG. 12, it is detected based on the positions of the variable inductors. It is conjectured that, when a change of the plasma at the transition point changes vertically, the change can not be grasped with the optical sensor. In this way, the discontinuous point may not become clear by one measurement depending upon the processing conditions but, the detection of the transition point becomes complimentary by using measurement devices arranged to complement it. To the contrary to this example, there is also a case where the detection is difficult only based on the positions of the variable inductors. In the case using the spectroscope, even though the light emission intensity is used here, a change of intensity ratio normalized by the light emission intensity in a certain wavelength region may also be used when there is a change in a ratio of radicals in plasma at the transition.

FIG. 14 is a diagram schematically showing another example of the matching box using variable capacitors included in the embodiment shown in FIG. 1 and the modification shown in FIG. 11. While in the embodiment and the modification described above positions of the variable inductors 127 and 128 in the matching box 124 are adjusted to match the radio frequency power, in the example shown in FIG. 14, when matching is conducted by using a matching box including variable capacitors 141 and 142 and a radio frequency inductor 143 disposed between them, the discontinuous point may be found from positions of these variable capacitors.

In the embodiment shown in FIG. 1, $Cl_2$ gas, HBr gas and $O_2$ gas are introduced as processing gas at flow rates of 20 ml/min, 100 ml/min, and 4 ml/min, respectively, the pressure in the vacuum processing chamber 120 is adjusted to 0.4 Pa, and around radio frequency power of 100 W introduced into the processing stage 108 the transition points are found for a plurality of reactors at a plurality of conditions. As for the conditions, the following six conditions are used.

In FIG. 15 a radar chart of the transition points at the respective conditions is shown. The microwave power at the transition point at each condition is an average value of microwave power at a transition point obtained from the light emission intensity, the variation of the light emission intensity, and the positions of the variable inductors. If a transition point is not obtained, its data is excluded. In the figure, a line 151 indicates an average value of microwave power at transition points in 110 normal semiconductor processing apparatuses.

In a certain apparatus (reactor) among them, the transition point tends to be higher by approximately 50 W on the whole as indicated by a line 152 and the apparatus (reactor) is different from other normal apparatuses (reactors). Such a machine difference needs to be corrected before processing for mass production of the semiconductor device is started. In the present embodiment, power which is actually output is made lower by approximately 50 W as compared with microwave power which is set in the apparatus having the large machine difference. The amount of power shift is determined by utilizing the fact that the microwave power at the transition point differs for each condition. In this case, correction is made to cause the processing condition in the vacuum processing chamber 120 to become the same as that in other apparatuses (reactors) by utilizing a microwave electric field having a power value obtained by adding 20 W to 1.04 times the preset power and the yield of semiconductor devices manufactured by the processing is improved.

In the plasma processing apparatus according to the embodiments described above, by adjusting the introduced effective radio frequency power to be the same value in a plurality of apparatuses and reactors, the difference in processing result among apparatuses or reactors caused when a process having the same specifications is processed at the same processing conditions in a plurality of apparatuses or reactors is reduced, the precision and yield of the processing is improved, and production of semiconductor devices having a higher degree of integration and finer patterns is facilitated.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:
1. A plasma processing method comprising:
   a step of placing a wafer having a film to be processed on a surface thereof on a sample stage disposed in a processing chamber within a reactor constituted of a vacuum vessel;
   a step of forming plasma in the processing chamber by supplying an electric field in the processing chamber from above; and a step of processing the wafer by using the plasma while supplying power from a radio frequency power supply to electrodes disposed in the sample stage via a matching box, the step of processing the wafer comprising:
- a step of detecting characteristic data including light emission intensity of the plasma, magnitude of time variation of the light emission intensity of the plasma, a matching position of the matching box, and a change of a value of a voltage of the radio frequency power supplied to the electrodes with respect to a value change of the power detected in advance by varying power of the electric field to a plurality of values during processing executed on a wafer which is a same in kind as the wafer; and
- a step of processing the wafer while matching a specific value of the power at which values of data of at least two kinds among the characteristic data make abrupt transition with the specific value detected by using the characteristic data which is detected during the processing executed on a wafer which is a same as the wafer in a different reactor.

2. The plasma processing method according to claim 1, wherein the electric field supplied into the processing chamber to form the plasma is a microwave electric field.

3. The plasma processing method according to claim 2, wherein the different reactor is a reactor installed in a different plasma processing apparatus.

4. The plasma processing method according to claim 1, wherein the different reactor is a reactor installed in a different plasma processing apparatus.

* * * * *